(12) United States Patent
Ostrowsky et al.

(10) Patent No.: US 6,611,930 B1
(45) Date of Patent: Aug. 26, 2003

(54) LINKED LISTS DIAGNOSTICS

(75) Inventors: Jacob Ostrowsky, Netanya (IL); Amir Dabby, Holon (IL)

(73) Assignee: Eci Telecom Ltd., Petach Tikva (IL)

( * ) Notice: Subject to any disclaimer, the term of this patent is extended or adjusted under 35 U.S.C. 154(b) by 0 days.

(21) Appl. No.: 09/500,665

(22) Filed: Feb. 9, 2000

(30) Foreign Application Priority Data

Oct. 27, 1999 (IL) .................................................. 132619

(51) Int. Cl.[7] .............................................. G11C 29/00
(52) U.S. Cl. .......................... 714/718; 714/55; 714/54
(58) Field of Search ............................ 714/48, 54, 55, 714/718, 765, 799; 709/215; 370/395.4

(56) References Cited

U.S. PATENT DOCUMENTS

| | | | |
|---|---|---|---|
| 5,838,915 A | 11/1998 | Klausmeier et al. ... | 395/200.45 |
| 5,845,310 A | 12/1998 | Brooks ................... | 711/3 |
| 6,157,935 A * | 12/2000 | Tran et al. .............. | 707/503 |
| 6,445,680 B1 * | 9/2002 | Moyal .................... | 370/236 |
| 6,487,202 B1 * | 11/2002 | Klausmeier et al. .... | 370/395 |

* cited by examiner

Primary Examiner—Phung M. Chung
(74) Attorney, Agent, or Firm—Browdy and Neimark, P.L.L.C.

(57) ABSTRACT

A method of determining the integrity of a linked list stored in a memory block, comprises the steps of, providing a series of independent bit positions, defining each of the independent bit positions to correspond to one of the cells, setting each of the independent bit positions to a predetermined setting, resetting each of the independent bit positions upon access of its defined corresponding cell, and then, after a predetermined interval testing the independent bit positions. If then any of the independent bit positions have not been reset by the time the test is made, an error condition is set.

16 Claims, 2 Drawing Sheets

RAM

| | | |
|---|---|---|
| 17 | DATA | 18 |
| 16 | DATA | 19 |
| 15 | DATA | |
| 14 | DATA | 17 |
| 13 | DATA | 14 |
| 12 | DATA | 16 |
| 11 | DATA | 13 |
| 10 | DATA | 12 |
| 9 | DATA | 10 |
| 8 | DATA | 11 |
| 7 | DATA | 8 |
| 6 | DATA | 7 |
| 5 | DATA | 9 |
| 4 | DATA | 5 |
| 3 | DATA | 6 |
| 2 | DATA | 4 |
| 1 | DATA | 3 |
| 0 | DATA | 1 |

FIG. 1

LINKED LISTS DIAGNOSTICS

FIELD OF THE INVENTION

The present invention relates to linked lists and more particularly but not exclusively to a method and apparatus for improving the reliability of systems that use linked lists.

BACKGROUND OF THE INVENTION

Linked lists are, generally speaking, data structures containing data items arranged with integrally provided pointers to the next data item. They are popular in software applications because they give to the outside world the illusion of continuous data storage blocks whilst in fact allowing use to be made of the next available storage space at any instant in time regardless of its spatial relationship with other storage spaces. Thus, a single memory block can safely store several sets of memory data packed together without risk of confusion.

In an ATM architecture, data cells awaiting transfer along the network are stored in external RAM or memory cache. The addresses of the memory cells may be advantageously stored in a linked list internal to an ASIC or other like chip for quick access. The ASIC may store both the aforesaid linked list and another list, of empty cells, a so-called empty bin, which is used to identify suitable addresses for new incoming cells. As any particular cell is read out for sending along the network, its address is added to the back of the empty bin to await its turn to be filled again. Preferably, the empty bin is also in the form of a linked list so that all newly available cells are made available in turn. Generally, a linked list used in the normal manner has first in first out properties. Alternatively, the empty bin, or any of the other linked lists, can be read out using a statistically based or other algorithm. As a further alternative, the empty bin could be implemented as a FIFO stack, but this restricts the choice of the next cell to be read out to that at the front of the list.

In any given circumstances there may be more than one cell queue, in addition to the empty bin, and more than one delay priority and each queue and each delay priority may have its own separate list, in accordance with the requirements of the system. All the queues however, generally share the same empty bin.

A typical ATM-based system uses cell buffer managers (CBMs), which comprise an input side, a switch and an output side. On the input side of a CBM, each entry in the linked list contains the location, in the external RAM, of the present cell. It also contains the address of the next entry in the present list. A read pointer is typically provided which points to the current location in the linked list, and, in order to read an entry in the linked list, the address of the current cell is retrieved from the linked list as is the address of the next entry. The address of the next entry is then used to update the read pointer so that the next entry itself can be read. In general, the current cell is then sent and the address thereof is sent to the end of the linked list that constitutes the empty bin so that the space can be reused. As mentioned above, the linked lists, including the empty list, need not be read in order. Rather, a scheduler can be used to specify which cell is read out, and statistical algorithms or priority requirements may be incorporated into the scheduler. In that case the linked list has to be reconnected after reading.

In the output side of a CBM, a more complex arrangement of linked lists allows for the same cells to be sent to one or more output ports, for example 12. A pointer to the same cell in memory is included in the linked list for each of the output ports and the cell is read out and sent to the respective output port at each read operation. A counter is used to keep track of multicast destinations and is decremented each time the cell is sent. The cell location is not added to the empty bin until the counter reaches zero, indicating that the cell has been sent to all required output ports. In an example, three or four linked list RAMs may be provided, each one divided into four destination ports.

As mentioned above, the empty bin may also be implemented as a linked list, for example using 32 k×20 bits. Each row may consist of a parity bit, the empty address and the counter, the empty address occupying 15 bits.

SUMMARY OF THE INVENTION

In accordance with a first aspect of the present invention there is provided a method of determining the integrity of at least one linked list stored in a plurality of cells in a memory block, comprising the steps of providing independent bit positions, defining each of said independent bit positions to correspond to one of said plurality of cells, setting each of said independent bit positions to a predetermined setting, resetting each of said independent bit positions upon access of its defined corresponding cell, after a predetermined interval testing said independent bit positions and if any of said independent bit positions have not been reset, setting an error condition.

Preferably, the predetermined interval is a time within which all of said plurality of cells can be expected to be accessed. This may be calculated as a number of accesses of cells in said memory block.

The independent bit positions may be contained in a separate memory block, and this is referred to herein as the diagnostic block.

Diagnostic testing of the linked list can be further enhanced by adding at least one check digit to an entry or to a data item in the linked lists. The entries in the linked list preferably comprise at least two data items each, namely a pointer to a data cell and a pointer to the next entry in the list.

According to a second aspect of the present invention there is provided apparatus for determining the integrity of a linked list, comprising a memory block for storing linked lists in a plurality of data cells and a series of independent data cell positions arranged to obtain diagnostic data of said data cells. Preferably, said diagnostic data is data indicative of whether a given data cell has been used within a predetermined time interval. Again, preferably said series of independent positions is a series of one-bit data storage positions each one operable to flag use of a different one of said plurality of data cells.

In an embodiment, each of said series of independent positions is operable to be set at the beginning of said predetermined time interval and is operable to be reset by one of a read and a write operation of a corresponding data cell. An embodiment further comprises a logic gate operable to test said series of cells at the end of said predetermined time interval, and to indicate that integrity has been compromised if any one of said series of cells has not been reset.

According to a third aspect of the present invention there is provided apparatus for measuring the integrity of one or more linked lists stored in a series of cells in a RAM, comprising a block of diagnostic bit positions each associated with a different one of the cells of the RAM, the apparatus further comprising a bit set device for setting each diagnostic bit position to a starting state, a bit reset device for resetting each diagnostic bit position from said starting state upon use of the corresponding cell within said RAM, an interval-determining device for determining the duration of an interval within which it may be expected that all cells on said RAM have been used, and an integrity determiner for determining whether all diagnostic bit positions have been reset at the end of said interval and issuing an alarm if any have not.

Preferably the staring state is high, a one, and said integrity determiner comprises a zero detector.

Preferably the integrity determiner comprises a multiple OR-gate.

The interval-determining device may be a timer. Alternatively, it may be a counter. The counter may count read operations of said linked lists. Alternatively, it may count write operations to said linked lists.

BRIEF DESCRIPTION OF THE DRAWINGS

For a better understanding of the invention and to show how the same may be carried into effect, reference is now made, purely by way of example, to the accompanying drawings, in which . . .

FIG. 1 is a generalized diagram of a RAM holding linked list data,

DESCRIPTION OF THE PREFERRED EMBODIMENTS

Figure 2:
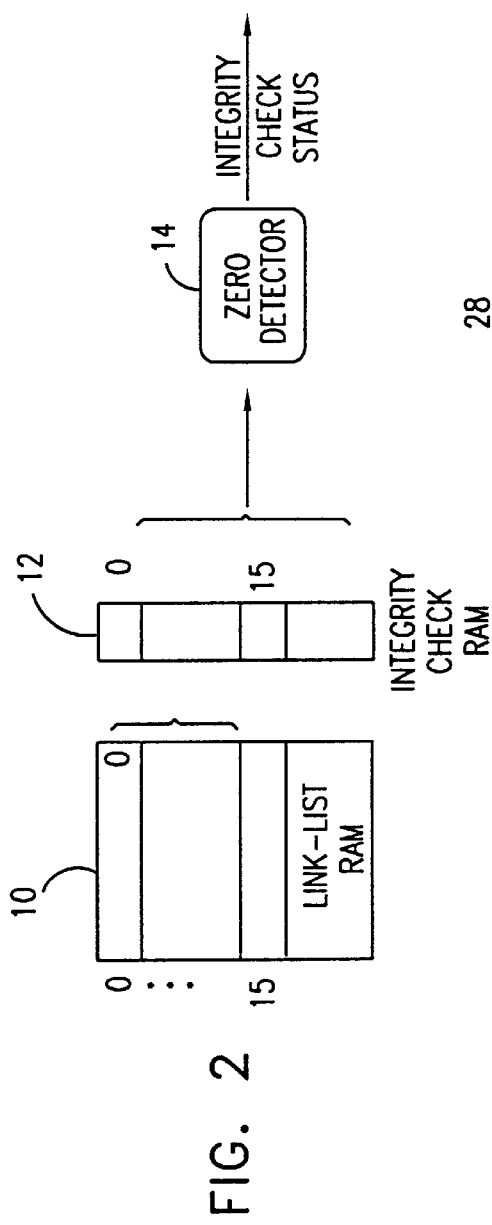
FIG. 2 is a generalized block diagram of a device according to a preferred embodiment of the present invention.

Reference is firstly made to FIG. 1 which is a simplified diagram showing a RAM 2 organized into two linked lists. Each entry in the RAM comprises 3 parts, an address part 4, a data part 6 and a pointer to the next address in the list indicated by reference numeral 8. It will be appreciated that the address column marked 4 does not necessarily indicate any physical part of the data entry but is generally a consequence of the hard-wired addressing system built into the RAM. The first list begins with entry 0, and is followed by entries 1, 3, 6, 7, 8, 11, 13, 14, and 17. The remaining entries belong to the second list, apart from entry number 15 which is empty. The use of the linked list allows more than one data queue to exist completely independently but intermingled in the same memory block.

In the following description, the linked lists are read from the front. However, in practice a scheduler may be used to read out cells. The scheduler may use a statistical or like algorithm or may use some form of priority to choose a cell other than the front cell from the linked list. In the case of a scheduler the list must be relinked following the read operation. Whether the linked list is read from the front or is read in some other manner using a scheduler makes no difference to the operation of the invention except that, in the case of a scheduler, time before resetting may be increased, as will be explained below.

According to a preferred embodiment of the present invention the data in the linked list is a pointer to data held in an external RAM, in particular a data unit for sending along a data network such as an ATM network. In this preferred embodiment, the linked lists are used as a means of storing data units in a buffering operation. The data units are read and sent on their way and the cell space is made available for a new linked list entry. Thus the cell spaces, and hence the linked list entry data units, are cycled through. An "empty bin" is preferably kept of available cell spaces, as described above, and the use of the first in, first out principle ensures that the cell spaces too are cycled through in an orderly fashion. Thus all of the cell spaces in the linked list RAM should be cycled through fairly quickly, the time depending on the speed of each data cell read operation, the speed of each data cell write operation, the number of operations that can be carried out simultaneously and the size of the RAM. As referred to above, if a scheduler is used and the cells are not cycled through in order, then the given time will be longer than if all of the linked lists are continually read from the front.

FIG. 1 is a general diagram of a linked list. As is explained elsewhere, embodiments of the present invention comprise linked lists at both the input and output of the CBM. At the input there is one-to-one correspondence between the linked list entries and the data. Thus a particular linked list entry position can be associated automatically with a position in the data memory. Hence it may be sufficient for the linked list to contain only the address column 4 and the pointer column 8.

Reference is now made to FIG. 2 which shows a linked list RAM 10 in which linked lists are stored for locating data units in an external RAM (not shown). The data units for the linked list itself comprise two 16 bit pointers, (one for the data cell and one for the next address) each having a 15 bit address and a parity check bit. In a current embodiment the check bit is calculated over the pointer using odd parity and is inserted as the most significant bit (bit 15). Each parity bit protects the pointer with which it is stored. It is written whilst forming the linked list and checked whilst reading from the RAM to raise a parity error status whenever an error is detected. Depending on the application the detection of a parity error can lead to reinitialization or to any other desired remedy. The use of more than one parity bit can permit error correction in addition to the error detection described above, as is known to those skilled in the art.

In a preferred embodiment of the present invention there is provided an integrity check RAM 12. The integrity check RAM 12 is considerably smaller than the linked list RAM 10, typically containing one or two bits for every complete pointer position in the linked list RAM 10. In operation, each of the bits in the integrity check RAM 12 is initially set to low. Then, as each entry in the linked list is accessed the corresponding entry is set to high. After a predetermined delay set by the software, which delay is long enough for all of the positions in the linked lists to have been used, as explained above, a zero detector 14 operates on the integrity check RAM 12 to determine whether any lows remain. If they do, this means that not all of the entry positions have been reached and is taken to imply a lack of integrity in the linked lists themselves on the RAM 12. An error integrity status flag is set.

The zero detector 14 operates by reading out a row at a time of the integrity check RAM 12 to ensure no lows remain. The row is preferably then reset to zero and the following row is read out.

Preferably, the bit positions on the integrity check RAM correspond to successive data positions on the linked list RAM 10.

Figure 3:
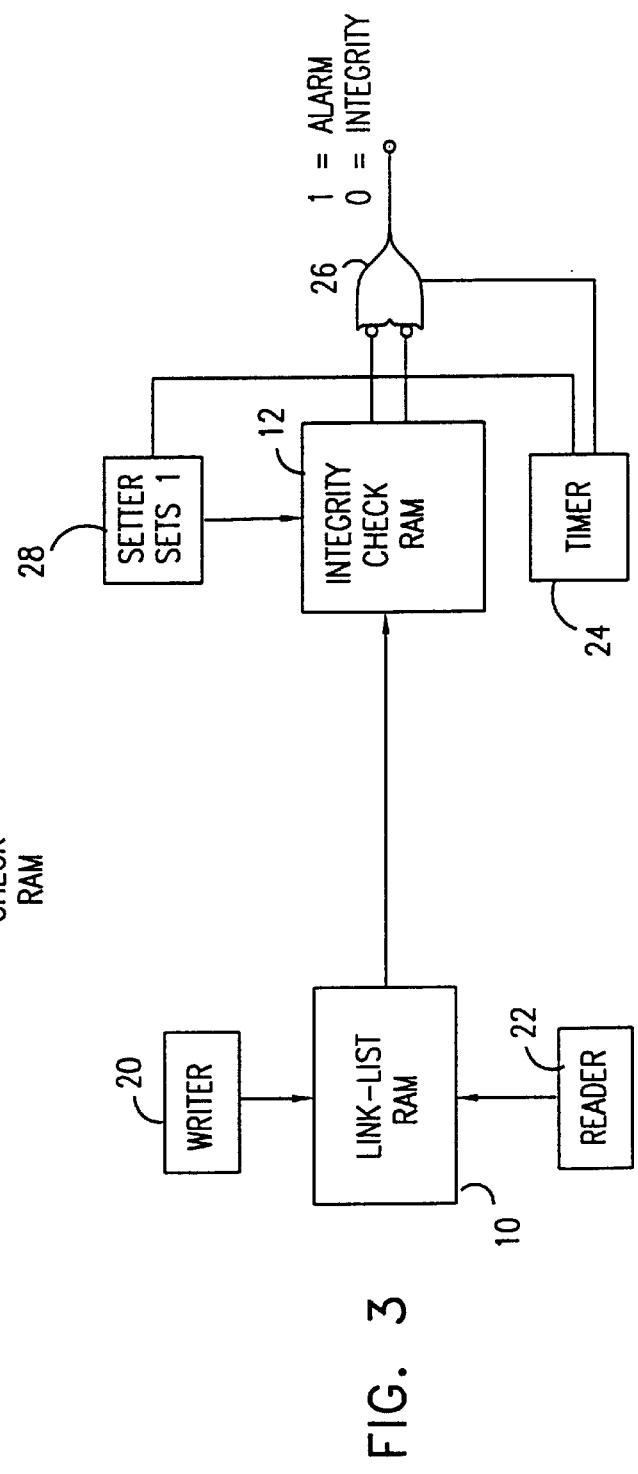
FIG. 3 is a more detailed block diagram of the embodiment of FIG. 2.

Reference is now made to FIG. 3, which shows in greater detail the device of FIG. 2. In FIG. 3 the linked list RAM 10 is associated with write circuitry 20 and read circuitry 22. The write circuitry writes linked list data into the RAM and the read circuitry 22 reads out the data. As either the read or write circuitry accesses a given address in the RAM 10, it resets a bit in the integrity check RAM 12 corresponding to the given address. Meanwhile a timer 24 measures a predetermined delay during which it is expected that all of the positions on the RAM 10 are cycled through. In an alternative embodiment, in place of a timer, a counter could be provided to count access operations so that the integrity measurement is made after a given number of accesses.

When the timer has reached the predetermined delay, the zero detector, here implemented by a multiple-input OR-gate 26 with NOR gates at each input, is operated. The use of an inverter at each input ensures that the low outputs indicating a fault appear as high's at the OR gate. The OR gate gives out a high if any of its inputs are high, and thus any lows in the integrity check RAM 12 are indicated by a high at the output of the OR gate. Thus the entire integrity check RAM may be tested, a row at a time, as explained above.

The presence of a high output from the OR-gate, at the same time as the control signal from the timer 24 is being asserted, preferably causes resetting of the system, as described above. The presence of a low output causes a setter device 28, which is connected to integrity check RAM 12, to set all of the bit positions in the integrity check RAM 12 to high, ready for the next integrity check round.

It is thus possible to apply a further integrity check to a RAM comprising a series of linked lists without in any way interfering with the smooth operation of the linked lists. No time overhead need be lost as all operations involved in the integrity check are carried out in parallel with the reading operations and no increase in data unit length is involved.

It is appreciated that various features of the invention which are, for clarity, described in the contexts of separate embodiments may also be provided in combination in a single embodiment. Conversely, various features of the invention which are, for brevity, described in the context of a single embodiment may also be provided separately or in any suitable subcombination.

It will be appreciated by persons skilled in the art that the present invention is not limited to what has been particularly shown and described hereinabove. Rather, the scope of the present invention is defined only by the claims that follow:

What is claimed is:

1. A method for diagnosing the integrity of at least one linked list stored in a plurality of cells in a memory block, comprising the steps of
   providing independent bit positions,
   defining each of said independent bit positions to correspond to one of said plurality of cells,
   setting each of said independent bit positions to a predetermined setting,
   resetting each of said independent bit positions upon access of its defined corresponding cell,
   after a predetermined interval testing said independent bit positions, and
   if any of said independent bit positions have not been reset, defining an error condition.

2. A method according to claim 1, wherein said predetermined interval is a time within which all of said plurality of cells can be expected to be accessed.

3. A method according to claim 2, wherein said independent bit positions are contained in a separate memory block.

4. A method according to claim 1, wherein said predetermined interval is a number of accesses of cells in said memory block.

5. A method according to claim 1, comprising the further step of adding at least one check digit to each data item in the linked lists.

6. Apparatus for determining the integrity of a linked list, comprising a memory block for storing linked lists in a plurality of storage cells and a series of independent positions arranged to obtain diagnostic data of said storage cells,
   wherein said diagnostic data is data indicative of whether a given storage cell has been used within a predetermined time interval.

7. Apparatus according to claim 6, wherein said series of independent positions is a series of independent bit positions each one operable to flag use of a different one of said plurality of storage cells.

8. Apparatus according to claim 6, wherein each of said series of independent positions is operable to be set at the beginning of said predetermined time interval and is operable to be reset by one of a read and a write operation of a corresponding storage cell.

9. Apparatus according to claim 8 further comprising a logic gate operable to test said series of positions at the end of said predetermined time interval, and to indicate that integrity has been compromised if any one of said series of positions has not been reset.

10. Apparatus for diagnosing the integrity of a linked list, comprising
    a block of diagnostic bit positions attachable to a RAM able to hold linked lists in a series of data cells, said apparatus further comprising a bit set device for setting each diagnostic bit position to a starting state, a bit reset device for resetting each diagnostic bit position from said starting state upon use of a corresponding data cell within said RAM, an interval determining device for determining the duration of an interval within which it may be expected that all data cells on said RAM have been used and an integrity determiner for determining whether all diagnostic bit positions have been reset at the end of said interval and issuing an alarm if any have not.

11. Apparatus according to claim 10, wherein said starting state is high and said integrity determiner comprises a zero detector.

12. Apparatus according to claim 10, wherein said integrity determiner comprises a multiple OR-gate.

13. Apparatus according to claim 10, wherein said interval determining device is a timer.

14. Apparatus according to claim 10, wherein said interval determining device is a counter.

15. Apparatus according to claim 14, wherein said counter is operable to count read operations of said linked lists.

16. Apparatus according to claim 14, wherein said counter is operable to count write operations to said linked lists.

* * * * *